(12) United States Patent
Yu et al.

(10) Patent No.: US 12,689,181 B2
(45) Date of Patent: Jul. 21, 2026

(54) MINIATURIZED MASTER OSCILLATOR POWER-AMPLIFIER STRUCTURE DIODE-PUMPED SOLID-STATE LASER

(71) Applicant: II-VI Delaware, Inc., Wilmington, DE (US)

(72) Inventors: Guanglong Yu, Fuzhou (CN); Xu Jia, Fuzhou (CN); Ming Zhao, Fuzhou (CN); Jian Ding, Fuzhou (CN); Hao Tan, Fuzhou (CN); Lei Lin, Fuzhou (CN)

(73) Assignee: II-VI Delaware, Inc., Wilmington, DE (US)

( * ) Notice: Subject to any disclaimer, the term of this patent is extended or adjusted under 35 U.S.C. 154(b) by 759 days.

(21) Appl. No.: 18/067,392

(22) Filed: Dec. 16, 2022

(65) Prior Publication Data

US 2023/0231361 A1     Jul. 20, 2023

(30) Foreign Application Priority Data

Jan. 20, 2022     (CN) ......................... 202210066003.X

(51) Int. Cl.
*H01S 5/04* (2006.01)
*H01S 5/50* (2006.01)

(52) U.S. Cl.
CPC ............ *H01S 5/041* (2013.01); *H01S 5/5027* (2013.01); *H01S 2302/00* (2013.01); *H01S 2303/00* (2013.01)

(58) Field of Classification Search
CPC .......... H01S 5/0085; H01S 5/50; H01S 5/125; H01S 5/5027; H01S 5/041

(Continued)

(56) References Cited

U.S. PATENT DOCUMENTS 8,953,647 B1 * 2/2015 Mead .................... H01S 3/1616
372/6
9,172,208 B1 * 10/2015 Dawson .................... H01S 3/30

(Continued)

OTHER PUBLICATIONS

Sakimura, Takeshi , et al., "1.55-um high-peak, high-average-power laser amplifier using an Er,Yb:glass planar waveguide for wind sensing coherent Doppler lidar", Optics Express 24175, Jun. 6, 2019, vol. 27:No. 17, 13 pages.

*Primary Examiner* — Daniel St Cyr
(74) *Attorney, Agent, or Firm* — TraskBritt

(57) ABSTRACT

The present disclosure discloses a miniaturized MOPA structure DPSSL (Diode Pumped Solid State Laser), which comprises a laser oscillator module and a laser amplifier module. The laser oscillator module consists of a seed laser and its collimating system, and the laser amplifier module consists of a laser pump module and a laser gain element. The seed laser with high beam quality is collimated by a collimation system, then input into the gain element; the pump laser is pumped into the gain element via end pump or side pump mode. The seed laser beam transmits into the gain medium and is reflected by the interface several times with the "Zigzag" path, which makes the seed laser fully gained and amplified, finally achieving high power and high beam quality laser output.

In this present disclosure, the laser gain material is doped with different rare-earth ion concentrations and processed into different shapes. Some polishing surfaces of the gain material are deposited with different coatings including HR coating and AR coating, on the one hand, to improve the absorption efficiency of the pump laser, on the other hand, to make the seed laser in the gain element achieve longer transmission distance by Zigzag transmission path, so that the energy in the gain medium can be fully extracted, and finally achieving high power laser output.

(Continued)

The present disclosure can adopt the host material doped at least at the same time with Er and Yb elements as the laser gain medium, adopt high-quality 1.55-micron or other medium emission peak band seed laser source as well as end or side pump mode, and can realize the laser output with high power and high beam quality.

Compared with the MOPA laser of the prior art, the present disclosure has the advantages of simple structure, small volume, and low cost.

17 Claims, 3 Drawing Sheets

(58) Field of Classification Search
USPC ......................................................... 359/333
See application file for complete search history.

(56) References Cited

U.S. PATENT DOCUMENTS

| | | | |
|---|---|---|---|
| 10,003,168 | B1 * | 6/2018 | Villeneuve ............ G01S 7/4818 |
| 10,845,480 | B1 * | 11/2020 | Shah ........................ G01S 17/10 |
| 2021/0208473 | A1 * | 7/2021 | Jackel ............... H01S 3/094007 |
| 2022/0291549 | A1 * | 9/2022 | Tsai ..................... G02B 6/0051 |

* cited by examiner

MINIATURIZED MASTER OSCILLATOR POWER-AMPLIFIER STRUCTURE DIODE-PUMPED SOLID-STATE LASER

CROSS-REFERENCE TO RELATED APPLICATIONS

The present application claims priority to Chinese Patent Application No. 202210066003.X filed Jan. 20, 2022. The aforementioned application is hereby incorporated by reference in its entirety.

TECHNICAL FIELD

The present disclosure relates to the field of lasers and Light Detection and Ranging (LiDAR), particularly to a miniaturized Master Oscillator Power-Amplifier (MOPA) structure diode-pumped solid-state (DPSS) laser.

BACKGROUND

MOPA, short for Master Oscillator Power-Amplifier, is a structure that couples high beam quality seed signal light and pump light into a laser gain medium to achieve high power amplification of the seed light. In the MOPA structure, a main oscillator produces high-quality seed light, and the output power size is adjustable. The MOPA structure can achieve the required time domain and frequency domain characteristics, as well as good beam quality for the output light. In the MOPA structure, the power amplifier amplifies the seed light, ensuring high beam quality of the output light and achieving high power and high energy output. The MOPA structure has the advantages of good pulse characteristics of a low power seed source and high-power amplification characteristics of a gain medium.

A Diode-Pumped Solid-State (DPSS) laser refers to a solid-state laser that uses a semiconductor laser diode (LD) as the pump source. Compared with the traditional solid-state laser, the laser working substance and excitation source of the DPSS laser are all composed of solid substances. The DPSS laser integrates the advantages of a traditional solid-state laser and a semiconductor laser and has the advantages of small size, lightweight, high efficiency, stable performance, and high reliability. The DPSS laser is one of the most promising new generations of laser sources.

The commonly used 1.55-micron band laser has many advantages, including being safe to the human eye, being transparent to the atmosphere, having the ability to penetrate strong smoke, and being ready-made for high-speed and high-sensitivity signal detectors for the optical communication industry. These advantages are possible even without temperature control. Based on the above advantages, 1.55-micron band lasers have important application value in Light Detection and Ranging (LiDAR), laser ranging, target recognition, and 3D imaging.

The existing MOPA 1.55-micron wavelength fiber laser uses an Er-doped fiber as the working medium, called EDFA (Erbium-Doped Fiber Amplifier), which is widely used in the field of long-distance transmission for an optical communication backbone network. The fiber length for the EDFA generally needs to be several meters to tens of meters, and its volume is large. The high price for the system has greatly limited its use in consumer areas, such as LiDAR.

In recent years, the Internet, cloud computing, 5G communications, artificial intelligence, and other technologies have made rapid developments. With these advancements, unmanned driving technology is becoming increasingly mature so that large-scale commercialization is expected to be achieved in the industry within the next 5 to 10 years. As one of the core components of unmanned driving technology, vehicle-mounted laser radar has a promising future. Its market capacity is very huge, and the annual demand will be up to tens of millions of sets. Developers are striving to break through the existing technical problems, especially those problems associated with light sources for laser radar so that large-scale production of low cost, miniaturized, high performance, and highly reliable onboard LiDAR systems can be realized.

SUMMARY OF THE DISCLOSURE

To solve the problems existing in the prior art, the present disclosure discloses a miniaturized Master Oscillator Power-amplifier (MOPA) structure Diode-Pumped Solid-State (DPSS) laser.

A laser assembly of the present disclosure comprises a laser oscillator module and a laser amplifier module. Seed light of high beam quality emitted from the laser oscillator module is amplified by the full gain of the laser amplifier module to achieve laser output of high power and high beam quality.

The laser oscillator module includes a seed laser and its collimation system.

Preferably, the seed laser is a semiconductor laser, including but not limited to a Laser Diode (LD), a Distributed Feedback Laser (DFB), a Distributed Bragg Reflector (DBR), a vertical-cavity surface-emitting laser (VCSEL), or the like. Alternatively, the seed laser is a DPSS (Diode-Pumped Solid-State) laser.

Preferably, the wavelength range of the seed laser is between 1300 nm to 1650 nm.

Further, the seed laser can be a fiber-coupled semiconductor laser, or a fiber-coupled DPSS laser, and the seed laser can provide output from the fiber. The optical fiber can be a single-mode or multi-mode optical fiber.

Preferably, the collimating system includes at least one collimating lens, which collimates or focuses the light beam emitted by the seed laser. The passing surface of the collimating lens can be coated with an antireflection film for the laser band of the seed light.

Optionally, the collimating system is an optical fiber collimator, which includes an optical fiber pigtail, a collimating lens, and a sleeve. The optical fiber head and the collimating lens are assembled and fixed in the sleeve. Through optical design and adjustment of the assembly, the laser output of the optical fiber can be collimated or focused according to the parameters required by the design of the disclosed laser configuration.

The laser amplifier module includes a laser pump component and a laser gain component. The laser pump component includes a semiconductor laser or includes a fiber-coupled semiconductor laser and a coupled lens. The laser gain medium of the laser gain component is processed into different shapes and is deposited with anti-reflection films and/or high reflection films on the polished surfaces.

Preferably, the semiconductor laser is an N (N≥1) LD Chip, an LD Bar, or an LD Stack. Each LD Bar or Stack can contain a plurality of laser light emitters and can emit high-power pump laser light. Alternatively, the semiconductor laser can include one or more VCSEL arrays, and each array can have a plurality of VCSEL chips, which can emit a high-power pumped laser.

Further, the wavelength range of the semiconductor laser can be between 800-nm to 1000 nm, especially for the wavelengths of 915 nm+/−15 nm, 940 nm+/−15-nm, 976 nm+/−15 nm.

Preferably, the coupling lens is a Fast Axis Collimator (FAC), or a combination of a FAC lens and a Slow Axis Collimator (SAC), or a lens array, or a single lens. The laser beam from the LD Bar/Stack can be collimated or focused in the fast axis direction or the fast and slow axis directions. Alternatively, the emitting point of each laser chip in the LD Bar/Stack and the VCSEL array, or the fiber-coupled output laser beam can be coupled into the laser gain medium.

Furthermore, the surface of the coupling lens can be coated with an anti-reflective film for the pumped laser band.

Preferably, for the laser gain element, the laser gain medium is doped with at least one rare earth element as the activated ion, and the host material can include but is not limited to, crystal, glass, ceramics, etc.

Further, the rare earth elements can include erbium (Er), ytterbium (Yb), neodymium (Nd), thulium (Tm) ions, etc., and the rare earth elements can be adjusted to different doping concentrations. The host material can include at least one of borate, silicate, phosphate, tungstate, molybdate, yttrium oxide ($Y_2O_3$), yttrium orthovanadate ($YVO_4$), or yttrium aluminum garnet (YAG) crystals, glass, or ceramics.

Preferably, according to the requirement of the light path transmission, the design of the laser gain components can be made into different shapes. The seed laser that is input into the gain element preferably passes through a "Zigzag" transmission path (i.e., a skew apeirogon) so the seed laser light propagates through a longer transmission path. Anti-reflective (AR) and high reflective (HR) coatings are deposited respectively on the surface of the laser gain element where the seed laser is incident and reflected. At the same time, an AR coating is also applied on the interface of the laser gain element facing the pump light that is incident thereto. At the same interface, according to the design requirements, the HR coating of the seed light band and the AR coating of the pump light band can be realized simultaneously.

Optionally, the laser gain element can also be two or more of the above elements connected in series, using optical bonding, diffusion bonding, or other bonding as required to set the elements in series to achieve the best beam propagation needs.

The pumping mode of the laser amplification module can be single-end pumping, double-end pumping, or side pumping.

The laser gain material is doped with different rare-earth ion concentrations and can be processed into different shapes. Polished surfaces of the gain material are deposited with different coatings including HR coating and AR coating. The coatings improve the absorption efficiency of the pump laser and make the seed laser in the gain element achieve a longer transmission distance by the Zigzag transmission path. In this way, the energy in the gain medium can be fully extracted to achieve high-power laser output.

The present disclosure can use crystal materials doped with at least Er and Yb elements as the laser gain medium, the DFB or DBR laser in 1.55-micron band as high-quality seed laser, the LD Bar or LD Stack laser coupling in 976 nm or 940 nm band as pump source in an end-pumping mode. It can achieve high beam quality and high-power laser output in a 1.55-micron band.

Compared with the MOPA laser of the prior art, the present disclosure has the advantages of a simple structure, a small volume, and low cost so the laser assembly of the present disclosure can be widely used in laser and LiDAR industries.

BRIEF DESCRIPTIONS OF THE DRAWINGS

The present disclosure is further elaborated in combination with the attached drawings.

DETAILED DESCRIPTION

To make the purpose, technical scheme, and advantages of the present disclosure clearer, the following is a further detailed description of the present disclosure combined with the attached drawings and practical examples. It should be understood that the specific embodiments described herein are intended only to explain and not to qualify the present disclosure.

Figure 1:
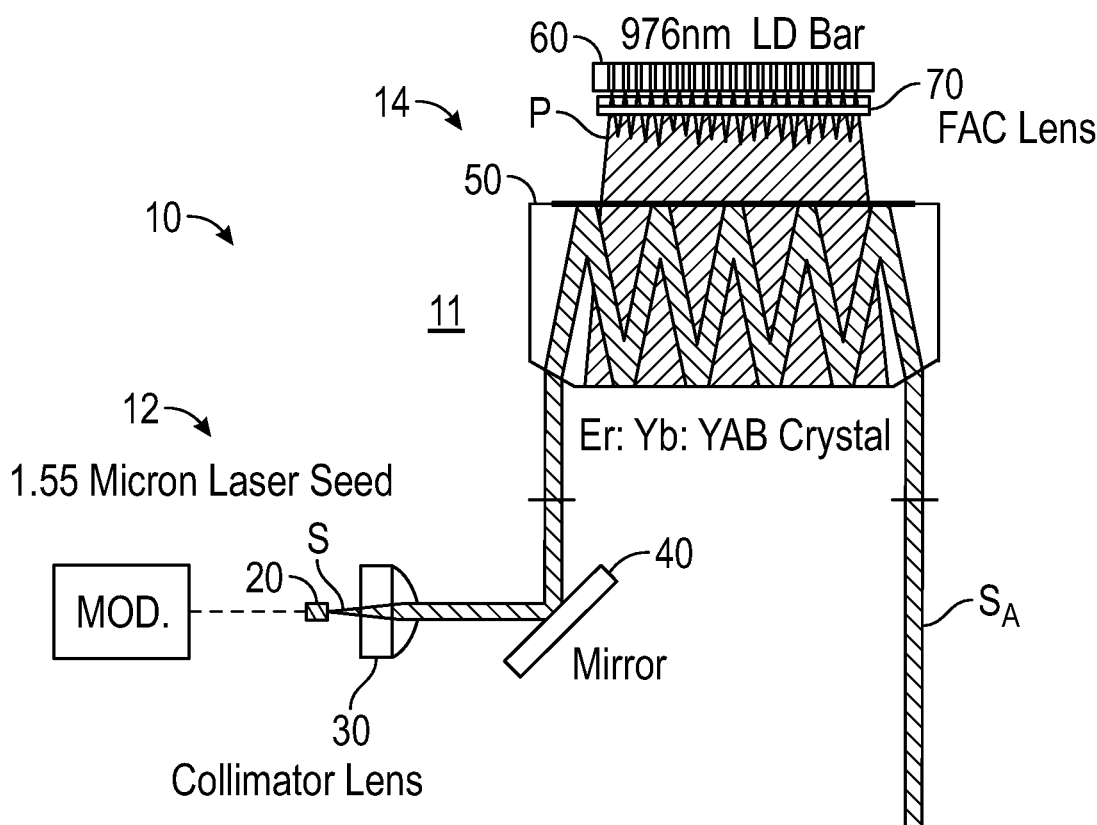
FIG. 1 illustrates a schematic diagram of a laser assembly according to a first embodiment of the present disclosure.

FIG. 1 shows a laser assembly 10 having a laser gain component 50 according to a first embodiment of the present disclosure. Details of the laser gain component 50 for the laser assembly 10 are further shown in FIG. 2.

The laser assembly 10 of the present disclosure comprises a laser oscillator module 12 and a laser amplifier module 14. Seed light S of high beam quality emitted from the laser oscillator module 12 is amplified by the full gain of the laser amplifier module 14 to achieve an amplified laser output SA of high power and high beam quality.

The laser oscillator module 12 includes a seed laser 20 and a collimator 30. The seed laser 20 can be a semiconductor laser, including but not limited to a Laser Diode (LD), a Distributed Feedback Laser (DFB), a Distributed Bragg Reflector (DBR), a vertical-cavity surface-emitting laser (VCSEL), or the like. Alternatively, the seed laser 20 can be a Diode Pumped Solid State (DPSS) laser. The wavelength range of the seed laser 20 can be between 1300 nm to 1650 nm. Depending on the implementation, a modulator (MOD) may be used to pulse the optical signal of the seed light S, and the modulator can use pulse shaping and other modulations.

The collimator 30 includes at least one collimating lens, which collimates or focuses the light beam emitted by the seed laser 20. A passing surface of the collimating lens 30 can be coated with an anti-reflective (AR) film suited for the band of the seed light S.

The laser amplifier module 14 includes a laser pump component 60 and a laser gain component 50. The laser pump component 60 can include a semiconductor laser or a fiber-coupled semiconductor laser and can include a coupling lens 70. For its part, the laser gain component 50 can be processed into different shapes for the laser gain medium.

As discussed below, the component 50 has anti-reflection (AR) films and/or high-reflection (HR) films deposited on the polished surfaces. The laser gain component can include upper and lower cladding layers and may be mounted on a substrate (11), water-cooled heat sink (not shown), or the like.

The semiconductor laser for the laser pump component 60 can be an N (N≥1) LD Chip, an LD Bar, or an LD Stack. Each LD Bar or LD Stack can contain a plurality of laser light emitters and can emit high power pump laser light P. Alternatively, the semiconductor laser for the laser pump component 60 can include one or more VCSEL arrays, and each array can have a plurality of VCSEL chips, which can emit a high-power pump light P. Further, the wavelength range of the semiconductor laser can be 800 nm to 1000 nm, especially for the wavelengths of 915 nm+/−15 nm, 940 nm+/−15 nm, 976 nm+/−15 nm.

The coupling lens 70 noted above can be a Fast Axis Collimator (FAC), a combination of a FAC lens and a Slow Axis Collimator (SAC) lens, a lens array, or a single lens. The pump light P from the LD Bar/Stack of the laser pump component 60 can be collimated or focused in the fast axis direction or the fast and slow axis directions. Alternatively, an emitting point of each laser chip in the laser pump component 60 made up of an LD Bar, LD Stack, or VCSEL array can be coupled into the laser gain medium of the laser gain component 50. Likewise, the fiber-coupled output of the pump light P from the laser pump component 60 can be coupled into the laser gain medium of the laser gain component 50. In any event, the surface of the coupling lens 70 can be coated with an anti-reflective film for the wavelength band of the pump light P.

The laser gain component 50 uses a laser gain medium doped with at least one active dopant (i.e., rare earth element for producing activated ions). The host material of the laser gain component 50 can include but is not limited to, borate, silicate, phosphate, tungstate, molybdate, yttrium oxide ($Y_2O_3$), yttrium orthovanadate ($YVO_4$), or yttrium aluminum garnet (YAG) crystals, glass, or ceramics. The rare earth elements can include erbium (Er), ytterbium (Yb), neodymium (Nd), thulium (Tm) ions, etc., and the rare earth elements can be adjusted to different doping concentrations.

Preferably, according to the requirement of the light path transmission, the design of the laser gain component 50 can be made into different shapes so that the seed laser light S that is input into the laser gain component 50 travels through a "Zigzag" (i.e., a skew apeirogon or a multi-bounce) propagation pattern to produce a longer transmission path. Incidence and reflection surfaces of the laser gain component 50 have AR and HR coatings deposited respectively on them. At the same time, an AR coating is also applied on the interface surface of the laser gain component 50 facing the pump light P incident thereto. At the same interface, according to the design requirements, the HR coating of the seed light band and the AR coating of the pump light band can be realized simultaneously.

In the laser assembly 10 shown in particular in FIG. 1, the seed laser 20 is a DFB laser that produces seed light S. The high-quality seed light S is collimating by a collimation lens 30 and is then reflected by a high reflection mirror 40. The beam enters an Er, Yb dual-doped yttrium-aluminum borate (YAB) crystal ($YAl_3(BO_3)_4$) crystal for the laser gain component 50. The beam waist is close to the middle area of the YAB crystal of the laser gain component 50.

Figure 2:
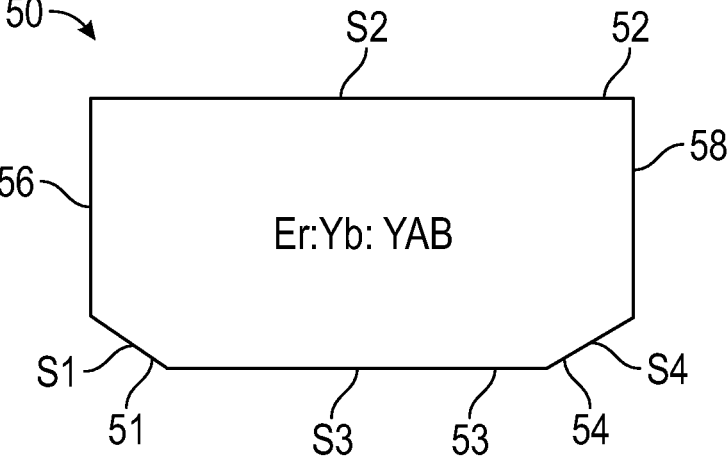
FIG. 2 illustrates a schematic diagram of a laser gain component having an Er and Yb double-doped YAB crystal according to the first embodiment of the present disclosure.

As shown in FIG. 2, the laser gain component 50 has a rectilinear shape having parallel sides 52, 53 between opposing ends 56, 58. One of the parallel sides 52 has one of the opposing incident surface S2, and the other of the parallel sides 53 has another of the opposing incident surface S3. A first edge 51 of the rectilinear shape angled from one of the parallel sides 53 towards the first opposing end 56 has the input surface S1, and a second edge 54 angled from the same parallel side 53 towards the second opposing end 58 has the output surface S4.

The incidence surface S1 of the YAB crystal as shown in FIG. 2 has an anti-reflection (AR) coating with a 1.55-micron band. Meanwhile, second and third opposing surfaces S2 and S3 of the YAB crystal for the laser gain component 50 are polished and have a high-reflection (HR) coating applied thereto for 1.55-micron wavelength of the seed light S, while the second and third surfaces S2 and S3 also have 976 nm AR coating for the pump wavelength of the pump light P.

The laser pump component 60 in FIG. 1 is an LD bar that produces pump light P of 976 nm, which is collimated at a fast axis by a FAC lens 70. End-pumping is adopted in this configuration from the end surface of the YAB crystal for the laser gain component 50. The seed light S of 1.55 microns is fully gained and amplified in the YAB crystal for the laser gain component 50 by the Zigzag transmission path. The 1.55-micron band amplified light SA is then output from the crystal's fourth surface S4. This output surface S4 is also AR coated for the 1.55-micron band. From this point, the 1.55-micron band amplified light SA can be used as part of an underlying system, such as a LiDAR system.

In this first embodiment, the DFB laser 20 uses a 1.55-micron band DFB laser as a high-quality seed light source, and the 976 nm band LD Bar laser coupling is used as the pump source in an end pumping mode. The YAB crystal for the laser gain component 50 doped with Er and Yb can be designed and processed into different shapes and is deposited with different anti-reflection or high reflection films on the polished surfaces. This is done on the one hand to make the absorption of 976 nm pump light P more efficient. This is also done to make the 1.55-micron seed light S in the gain medium of the crystal transmit via a Zigzag pattern for a longer transmission path so that the energy in the gain medium of the laser gain component 50 can be fully extracted. In the end, the laser assembly 10 can achieve high efficiency, high power, and high beam quality of the laser output of the amplified seed light SA at 1.55 microns.

In this first embodiment, the wavelength range for the pump wavelength 976-nm can be in a band between 900 nm to 1000 nm. Moreover, the wavelength range for the seed wavelength 1.55-micron can be in a band between 1500-nm to 1650-nm.

The laser assembly 10 of this first embodiment can be simple, compact, and miniaturized. To fabricate the laser assembly 10, high-precision alignment lines can be marked with a fabrication laser (not shown) onto a heat dissipation substrate (11) for the laser assembly 10. Each of the collimating and reflecting optical elements 30 and 40, the YAB crystal for the laser gain component 50, the LD Bar, and the FAC Lens 70 can be arranged on the substrate (11) and fixed according to marked positions, which not only has high alignment accuracy and assembly efficiency but also can realize automatic assembly.

Figure 3:
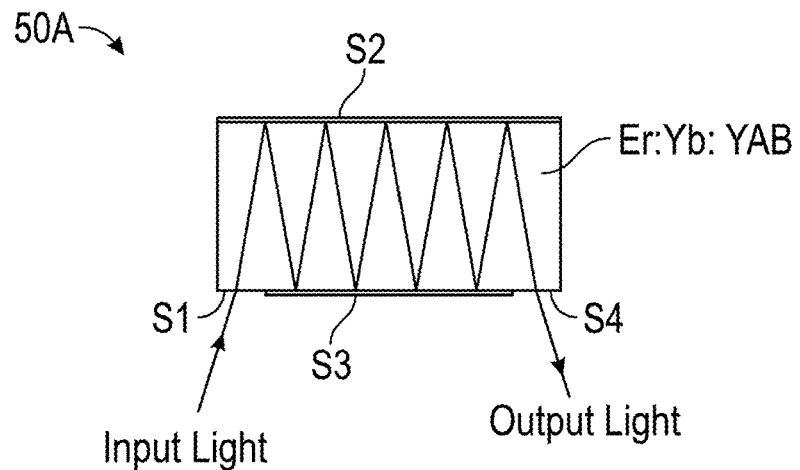
FIG. 3 illustrates another laser gain component having an Er and Yb double-doped YAB crystal in accordance with a second embodiment of the present disclosure.

As shown in FIG. 3, a different laser gain component 50A according to a second embodiment can be used for the laser assembly 10 as disclosed herein. This laser gain component 50A is a yttrium-aluminum borate (YAB) crystal processed into a rectangle shape. The coating on the surfaces S1 to S4 is consistent with the laser gain component 50 in the first embodiment. As before, the laser gain component 50A has parallel sides between opposing ends. One of the parallel sides has one of the opposing incident surface S2, and the other of the parallel sides has another of the opposing incident surface S3. Rather than having angled edges as in the first embodiment, the same parallel side has the input surface S1 towards one opposing end and has the output surface S4 towards the other opposing end. The YAB processing of this embodiment is simpler, and the coating is divided into regions on the same plane, side, or edge, which can be achieved using a coating fixture or a photoresist mask.

Figure 4:
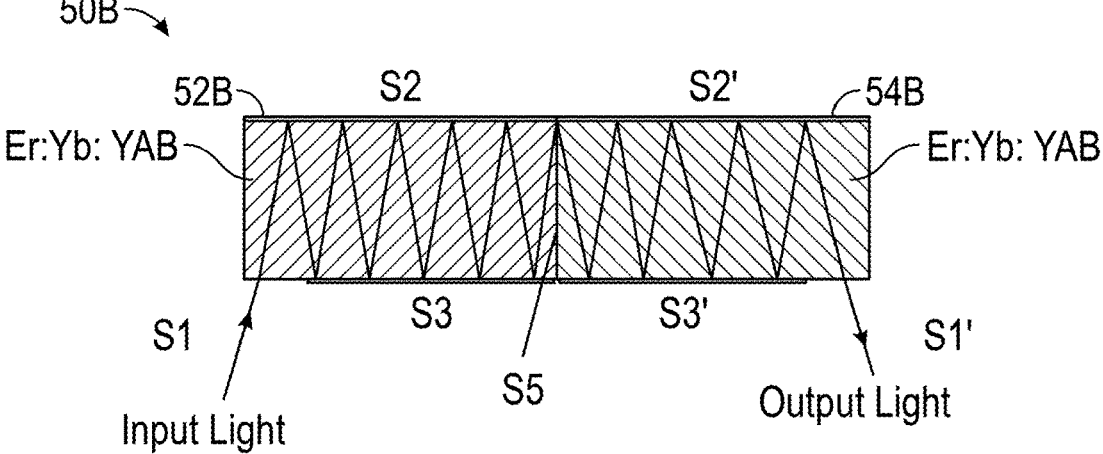
FIG. 4 illustrates yet another laser gain component having two Er, Yb: YAB crystals connected in series in accordance with a third embodiment of the present disclosure.

As shown in FIG. 4, yet another laser gain component 50B according to a third embodiment can be used for the laser assembly 10 as disclosed herein. This laser gain component 50B includes two yttrium-aluminum borate (YAB) crystals 52B, 54B connected in series. The interface between the crystals 52B, 54B is an interface surface S5. The input surface S1 and the output surface S1' are coated with anti-reflective film for the 1.55-micron band. The opposing incident surfaces S2, S2' and S3, S3' are coated with high reflective film for the 1.55-micron band and with anti-reflective film for the 976-nm band, respectively. Serial bonding methods can be used to connect the crystals 52B, 54B together and can include optical bonding, deepening (diffusion) bonding, or other bonding techniques that can hold the two crystals 52B, 54B together in high strength. By concatenating the two crystals 52B, 54B together, it is possible to produce a resulting crystal for the laser gain component 50B that is twice the size. When the desired crystal of a large size is difficult to grow and obtain, this concatenating method can not only meet the requirements of some high-power designs for a large gain crystal but can also greatly improve the crystal utilization rate and reduce the costs.

It is not difficult to understand that the serial connection method in this implementation can be extended to three or more crystals 52B, 54B.

Figure 5:
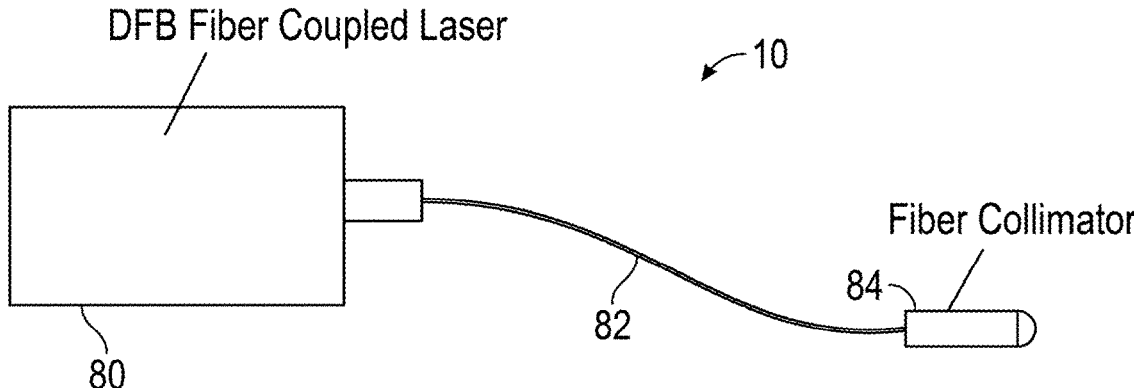
FIG. 5 illustrates a fiber-coupled laser with a fiber collimator in accordance with a fourth embodiment of the present disclosure.

According to other embodiments, the seed laser 20 of the laser assembly 10 can be a fiber-coupled semiconductor laser, or a fiber-coupled DPSS laser, and the seed laser 20 can provide output from an optical fiber, which can be a single-mode or a multi-mode optical fiber. In a fourth embodiment of the present disclosure, for example, the seed laser (20), the collimating lens (30), and the mirror (40) in the previous example of the laser assembly 10 from FIG. 1 are replaced by a fiber-coupled seed laser 80 coupled with an opticl fiber 82 to a fiber collimator 84, as shown in FIG. 5.

In this embodiment, the optical fiber collimator 84 is used as the collimating system of the laser assembly 10. The fiber collimator 84 can include an optical fiber pigtail, a collimating lens (not shown), and a sleeve (not shown). The optical fiber head and the collimating lens are assembled and fixed in the sleeve. Through optical design and adjustment of assembly, the laser output of the optical fiber 82 can be collimated or focused according to the parameters required by the design of the disclosed laser assembly.

By designing the parameters of the fiber collimator 84, the beam waist of the collimator can be located at the center of a YAB crystal (not shown) for a laser gain component of the disclosed assembly. Compared with the implementation in FIG. 1, the disclosed laser assembly using the fiber-coupled seed laser 80 and the fiber collimator 84 of this implementation is simpler.

It is not difficult to understand that in addition to the 1.55-micron band in the above examples, the laser assembly 10 of the present disclosure can also be widely used for seed light amplification and output in other bands. For example, if the seed light source of the source laser 20, 80 is changed to the 1342-nm band, the pump light band of the laser pump component 60 is changed to 880-nm, and the laser gain material for the laser gain component 50 is changed to neodymium-doped yttrium orthovanadate (Nd:YVO$_4$), then the laser assembly 10 can produce a 1342-nm band laser output with high power and high beam quality.

Figure 6:
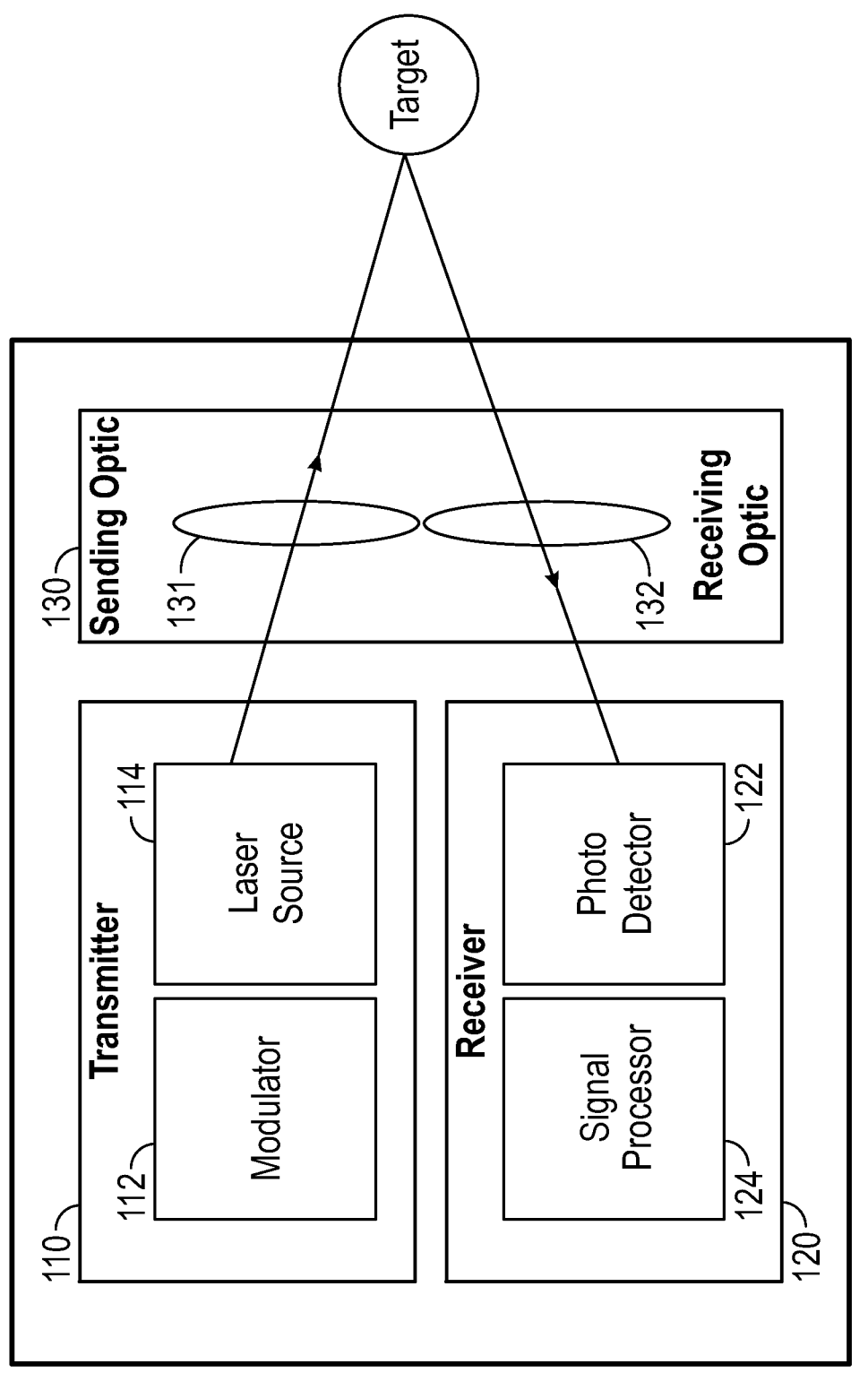
FIG. 6 illustrates a schematic diagram of a system for using the disclosed laser assembly.

The laser assembly 10 as disclosed herein can be used in several types of systems. For example, FIG. 6 illustrates a schematic diagram of a Light Detection and Ranging (LiDAR) system 100 that can use the disclosed laser assembly. The LiDAR system has a transmitter 110, a receiver 120, and imaging components 130. These components are only schematically shown here as an example. Additional optical elements (lenses, mirrors, diffusers) and the like can be used. Additionally, beam steering can be performed using beam steering elements.

In the transmitter 110, a modulator 112 and laser source 114 having the disclosed laser assembly generates a laser beam that passes through a sending optic 131 to a target. The laser beam can be pulsed, phase-shifted, or frequency modulated. The reflected beam from the target passes through a receiving optic 132 to a photodetector 122 of the receiver 120. For scanning LiDAR, a scanning element in the imaging system can be used. In flash LiDAR, the photodetector 122 can include an array of photodetectors. A signal processor 124 processes the received light to measure the time-of-flight (ToF) and to determine the location of the target.

The present disclosure can also be changed into various structures and assembly parts according to design requirements.

Although the present disclosure is specifically displayed and introduced in combination with the preferred implementation plan, the technical personnel in the field concerned should understand that all changes made to the present disclosure in form and details are protected by the present disclosure without deviating from the spirit and scope of the present disclosure defined by the attached claims.

What is claimed is:

1. A laser assembly, comprising:
a seed laser configured to produce seed light at an input wavelength;
a collimator configured to collimate the seed light into a collimated beam;
a laser gain component having an input surface, first and second opposing incident surfaces, and an output surface, the laser gain component having a host material doped with at least one active dopant, the laser gain component arranged to receive the collimated beam at the input surface, the first and second opposing incident surfaces being configured to repeatedly reflect the collimated beam internal to the laser gain component along a skew apeirogon,
wherein the laser gain component comprises a rectilinear shape having parallel sides between opposing ends, a first of the parallel sides having the first opposing incident surface, a second of the parallel sides having the second opposing incident surface, a first edge of the rectilinear shape is adjacent the second of the parallel sides, is angled from the second of the parallel sides towards a first of the opposing ends, and includes the input surface;
wherein a second edge of the rectilinear shape is adjacent the second of the parallel sides, is angled from the second of the parallel sides towards a second of the opposing ends, and includes the output surface; and a pump laser configured to produce a span of pump light at a pump wavelength, the span of the pump light being incident to the first opposing incident surface of the laser gain component, the pump wavelength being different from the input wavelength and being configured to interact with the at least one active dopant of the laser gain component and thereby amplify the seed light, wherein the output surface of the laser gain component being configured to output the amplified seed light.

2. The assembly of claim 1, wherein the seed laser is selected from the group consisting of a semiconductor laser, a fiber-coupled semiconductor laser, a Laser Diode (LD), a Distributed Feedback (DFB) laser, a Distributed Bragg Reflector (DBR), a vertical-cavity surface-emitting laser (VCSEL), a Diode-Pumped Solid-State (DPSS) laser, and a fiber-coupled DPSS laser.

3. The assembly of claim 1, wherein the input wavelength of the seed laser is in a band between 1300 nm to 1650 nm.

4. The assembly of claim 1, wherein the collimator comprises at least one collimating lens having a passing surface, the passing surface being coated with an anti-reflection coating for the input wavelength of the seed light.

5. The assembly of claim 1, wherein the collimator comprises an optical fiber collimator having an optical fiber pigtail, a collimating lens, and a sleeve.

6. The assembly of claim 1, wherein the pump laser is selected from the group consisting of a semiconductor laser, a fiber-coupled semiconductor laser and a coupled lens, an N (N≥1) LD Chip, an LD Bar, an LD Stack, and one or more VCSEL arrays.

7. The assembly of claim 1, wherein the pump wavelength of the pump laser is in a band between 800 nm to 1000 nm, especially for the wavelengths of 915-nm+/−15 nm, 940 nm+/−15 nm, 976-nm+/−15 nm.

8. The assembly of claim 1, wherein the pump laser comprises a coupling lens selected from the group consisting of a Fast Axis Collimator (FAC), a combination of a FAC lens, and a Slow Axis Collimator (SAC), a lens array, and a single lens.

9. The assembly of claim 8, wherein a surface of the coupling lens is coated with an anti-reflective coating for the pump wavelength.

10. The assembly of claim 1, wherein the host material of the laser gain component is selected from the group consisting of borate, silicate, phosphate, tungstate, molybdate, crystal, yttrium oxide ($Y_2O_3$) crystal, yttrium orthovanadate ($YVO_4$) crystal, yttrium aluminum garnet (YAG) crystal, neodymium-doped yttrium orthovanadate ($Nd{:}YVO_4$), glass, and ceramic.

11. The assembly of claim 1, wherein the at least one active dopant is selected from the group consisting of erbium (Er), ytterbium (Yb), neodymium (Nd), and thulium (Tm).

12. The assembly of claim 1, wherein the input and output surfaces comprise an anti-reflective coating for the input wavelength; and wherein the first and second opposing incident surfaces comprise a high-reflection coating for the input wavelength.

13. The assembly of claim 1, wherein the first opposing incident surface comprises an anti-reflective coating for the pump wavelength.

14. The assembly of claim 1, wherein the laser gain component comprises two or more elements bonded in series with one another.

15. The assembly of claim 1, wherein the first edge of the rectilinear shape is angled from the second of the parallel sides such that the collimated beam incident thereto is optically communicated to the first opposing incident surface.

16. The assembly of claim 15, wherein:

the second edge of the rectilinear shape is angled from the second of the parallel sides such that the collimated beam along the skew apeirogon is incident thereon after a reflection from the first opposing incident surface.

17. A Light Detection and Ranging (LiDAR) system having a laser assembly according to claim 1.

* * * * *